US012568864B2

(12) United States Patent
Tsai et al.

(10) Patent No.: US 12,568,864 B2
(45) Date of Patent: Mar. 3, 2026

(54) STACKED PACKAGE STRUCTURE INCLUDING A CHIP DISPOSED ON A REDISTRIBUTION LAYER AND A MOLDING LAYER COMPRISES A RECESS

(71) Applicant: POWERTECH TECHNOLOGY INC., Hsinchu County (TW)

(72) Inventors: Pei-chun Tsai, Hsinchu County (TW); Hung-hsin Hsu, Hsinchu County (TW); Shang-yu Chang Chien, Hsinchu County (TW); Chia-ling Lee, Hsinchu County (TW)

( * ) Notice: Subject to any disclaimer, the term of this patent is extended or adjusted under 35 U.S.C. 154(b) by 369 days.

(21) Appl. No.: 18/203,668

(22) Filed: May 31, 2023

(65) Prior Publication Data

US 2024/0120325 A1 Apr. 11, 2024

(30) Foreign Application Priority Data

Oct. 7, 2022 (TW) ................................... 111138309

(51) Int. Cl.
*H10W 42/20* (2026.01)
*H10W 70/60* (2026.01)
(Continued)

(52) U.S. Cl.
CPC ........... *H10W 90/00* (2026.01); *H10W 42/20* (2026.01); *H10W 70/60* (2026.01); *H10W 70/611* (2026.01); *H10W 74/016* (2026.01); *H10W 74/019* (2026.01); *H10W 74/111* (2026.01); *H10W 90/401* (2026.01); *H10W 90/701* (2026.01); *H10W 72/07352* (2026.01);

*H10W 72/327* (2026.01); *H10W 74/142* (2026.01); *H10W 74/15* (2026.01);
(Continued)

(58) Field of Classification Search
CPC ........... H01L 23/3107; H01L 23/49811; H01L 23/5385; H01L 23/552; H01L 24/16; H01L 24/32; H01L 24/33; H01L 24/73; H01L 24/81; H01L 21/565; H01L 21/568; H10W 42/20; H10W 74/016; H10W 74/019; H10W 74/111; H10W 90/401; H10W 90/701; H10W 90/724; H10W 90/734

See application file for complete search history.

(56) References Cited

U.S. PATENT DOCUMENTS

| | | | |
|---|---|---|---|
| 8,754,514 B2 | 6/2014 | Yu et al. | |
| 11,049,782 B2 * | 6/2021 | Lee ..................... | H01L 23/5389 |

(Continued)

FOREIGN PATENT DOCUMENTS

| | | |
|---|---|---|
| TW | 1478314 B | 3/2015 |
| TW | 201727854 A | 8/2017 |

*Primary Examiner* — Khiem D Nguyen

(57) ABSTRACT

A stacked package structure and a manufacturing method thereof are provided. The stacked package structure includes an upper redistribution layer, a first chip, and an upper molding layer. The first chip is disposed on the upper redistribution layer and is electrically connected to the upper redistribution layer. The upper molding layer is disposed on the first chip and the upper redistribution layer, and is configured to package the first chip. The upper molding layer includes a recess, the recess is recessed relative to a surface of the upper molding layer away from the upper redistribution layer, and the recess is circumferentially formed around a periphery of the upper molding layer.

11 Claims, 9 Drawing Sheets

10

(51) Int. Cl.

| | | |
|---|---|---|
| *H10W 74/01* | (2026.01) | |
| *H10W 74/10* | (2026.01) | |
| *H10W 90/00* | (2026.01) | |
| *H10W 72/00* | (2026.01) | |
| *H10W 72/30* | (2026.01) | |
| *H10W 74/15* | (2026.01) | |
| *H10W 80/00* | (2026.01) | |

(52) U.S. Cl.

CPC ........ *H10W 80/314* (2026.01); *H10W 90/724* (2026.01); *H10W 90/734* (2026.01); *H10W 90/736* (2026.01)

(56) References Cited

U.S. PATENT DOCUMENTS

| 11,328,971 | B2 | 5/2022 | Yeh et al. | |
|---|---|---|---|---|
| 2004/0155331 | A1* | 8/2004 | Thurgood | H01L 23/3128 |
| | | | | 257/730 |
| 2014/0264813 | A1* | 9/2014 | Lin | H01L 23/295 |
| | | | | 257/690 |
| 2017/0221859 | A1* | 8/2017 | Chen | H01L 21/78 |
| 2019/0206824 | A1* | 7/2019 | Lu | H01L 24/20 |
| 2021/0028147 | A1* | 1/2021 | Yu | H01L 24/19 |

* cited by examiner 120     140     130     150     120

120     150

160
110

193    181   180         190'

302

301

170        150   120      140    180     130      160      110

STACKED PACKAGE STRUCTURE INCLUDING A CHIP DISPOSED ON A REDISTRIBUTION LAYER AND A MOLDING LAYER COMPRISES A RECESS

CROSS REFERENCE TO RELATED APPLICATIONS

This application claims priority to Taiwan Application Serial No. 111138309, filed Oct. 7, 2022, the disclosure of which is incorporated herein by reference.

FIELD OF DISCLOSURE

The present disclosure relates to the field of semiconductors, in particular to a stacked package structure and a manufacturing method thereof.

BACKGROUND

At present, there are two main development directions for advanced packaging. One is to reduce a package area to make it close to a size of a chip, and the other is to integrate multiple chips in one package to increase internal integration density of the package. The use of multi-chip stack packaging technology or system-in-package technology can realize the integration of a variety of chips with different functions in a product, thereby manufacturing a lightweight, compact, high-speed, multi-functional, and high-performance product. Therefore, for a multi-chip package structure, how to realize electrical connection between multiple components without increasing a package width is a focus of current industry research and a technical problem to be solved.

Accordingly, the present disclosure provides a stacked package structure and a manufacturing method thereof to solve the above technical problems.

SUMMARY OF DISCLOSURE

The present disclosure provides a stacked package structure and a manufacturing method thereof, which ensure that electrical connection between a plurality of components is achieved without increasing a size of the package.

In one aspect, the present disclosure provides a stacked package structure including: an upper redistribution layer, a first chip, and an upper molding layer. The upper redistribution layer includes a first surface and a second surface opposite to the first surface. The first chip is disposed on the first surface of the upper redistribution layer and electrically connected to the upper redistribution layer. The upper molding layer is disposed on the first chip and the first surface of the upper redistribution layer, and is configured to encapsulate the first chip. The upper molding layer includes a recess, the recess is recessed relative to a surface of the upper molding layer away from the upper redistribution layer, and the recess is formed around a periphery of the upper molding layer.

In some embodiments, the surface of the upper molding layer away from the upper redistribution layer includes at least a first stepped surface and a second stepped surface, and the first stepped surface is a bottom surface of the recess.

In some embodiments, the stacked packaging structure further includes a lid. The lid is disposed on the upper molding layer.

In some embodiments, the upper molding layer further includes an opening, and the opening is configured to expose a non-active surface of the first chip. The stacked package structure further includes a thermal interface material, the thermal interface material is disposed on the upper molding layer and covers the non-active surface of the first chip, and the thermal interface material is disposed between the lid and the upper molding layer.

In some embodiments, the stacked packaging structure further includes an electromagnetic interference (EMI) shielding layer. The EMI shielding layer covers the surface of the upper molding layer.

In some embodiments, the stacked packaging structure further includes a lower molding layer and a lower redistribution layer. The lower molding layer is disposed on the second surface of the upper redistribution layer, and the lower redistribution layer disposed on a surface of the lower molding layer away from the upper redistribution layer. The EMI shielding layer further covers side surfaces of the upper molding layer, the upper redistribution layer, the lower molding layer, and the lower redistribution layer.

In some embodiments, the stacked packaging structure further includes a second chip and a third chip. The second chip and the third chip are disposed on the second surface of the upper redistribution layer and electrically connected to the upper redistribution layer, the second chip is laterally adjacent to the third chip, and the first chip is electrically connected to the third chip and the second chip through the upper redistribution layer.

In some embodiments, the stacked packaging structure further includes a lower molding layer disposed on the second surface of the upper redistribution layer, and configured to encapsulate the second chip and the third chip. Material of the lower molding layer is different from material of the upper molding layer.

In some embodiments, a coefficient of thermal expansion of the material of the lower molding layer is different from a coefficient of thermal expansion of the material of the upper molding layer.

In some embodiments, the stacked packaging structure further includes a lower redistribution layer, at least one conductive pillar, and a plurality of solder balls. The lower redistribution layer is disposed on a surface of the lower molding layer away from the upper redistribution layer. The at least one conductive pillar is electrically connected the upper redistribution layer and the lower redistribution layer. The plurality of solder balls are disposed on a surface of the lower redistribution layer away from the lower molding layer.

In some embodiments, an orthographic projection of the at least one conductive pillar on the lower redistribution layer overlaps with an orthographic projection of the first chip on the lower redistribution layer, and the first chip is electrically connected to the at least one conductive pillar through the upper redistribution layer.

In another aspect, the present disclosure also provides a manufacturing method of a stacked packaging structure, including: providing a carrier; disposing a first chip on the carrier; forming a molding layer on the first chip and the carrier, where the molding layer is configured to encapsulate the first chip; forming an upper redistribution layer on the first chip and a surface of the molding layer away from the carrier, where the first chip is electrically connected to the upper redistribution layer; removing the carrier; and removing a portion of the molding layer to form an upper molding layer, the upper molding layer includes a recess, the recess is recessed relative to a surface of the upper molding layer away from the upper redistribution layer, and the recess is formed around a periphery of the upper molding layer.

In some embodiments, the surface of the upper molding layer away from the upper redistribution layer includes at least a first stepped surface and a second stepped surface, and the first stepped surface is a bottom surface of the recess.

In some embodiments, after forming the upper molding layer, the manufacturing method further includes: disposing a lid on the upper molding layer.

In some embodiments, the upper molding layer further includes an opening, and the opening is configured to expose a non-active surface of the first chip. The manufacturing method further includes: forming a thermal interface material on the upper molding layer. The thermal interface material covers the non-active surface of the first chip, and the thermal interface material is disposed between the lid and the upper molding layer.

In some embodiments, after forming the upper molding layer, the manufacturing method further includes: forming an electromagnetic interference (EMI) shielding layer on the surface of the upper molding layer.

In some embodiments, after forming the upper redistribution layer, the manufacturing method further includes: disposing a second chip and a third chip on a surface of the upper redistribution layer away from the first chip. The second chip and the third chip are electrically connected to the upper redistribution layer, the second chip and the third chip are laterally adjacent, and the first chip is electrically connected to the third chip and the second chip through the upper redistribution layer.

In some embodiments, the manufacturing method of the stacked packaging structure further includes: forming a lower molding layer on a surface of the upper redistribution layer away from the first chip. The lower molding layer is configured to encapsulate the second chip and the third chip, and material of the lower molding layer is different from material of the upper molding layer.

In some embodiments, a coefficient of thermal expansion of the material of the lower molding layer is different from a coefficient of thermal expansion of the material of the upper molding layer.

In some embodiments, before forming the lower molding layer, the manufacturing method further includes: forming at least one conductive pillar on a surface of the upper redistribution layer away from the first chip. After forming the lower molding layer, the manufacturing method further includes: forming a lower redistribution layer on a surface of the lower molding layer away from the upper redistribution layer, where the at least one conductive pillar is electrically connected to the upper redistribution layer and the lower redistribution layer; and forming a plurality of solder balls on a surface of the lower redistribution layer away from the lower molding layer.

In some embodiments, an orthographic projection of the at least one conductive pillar on the lower redistribution layer overlaps with an orthographic projection of the first chip on the lower redistribution layer, and the first chip is electrically connected to the at least one conductive pillar through the upper redistribution layer.

In comparison with the prior art, in the stacked package structure and the manufacturing method of the present disclosure, the conductive pillar, the first chip, the second chip, and the third chip are arranged inside the stacked package structure by using an embedded technology, which minimizes an external dimension of the stacked package structure and maintains height and packaging requirements. Furthermore, a miniaturized and compact design of multi-chip 3D packaging is realized by the upper redistribution layer and the lower redistribution layer. On the other hand, the present disclosure can effectively solve a problem of warpage of the stacked package structure by limiting materials and structures of the upper molding layer and the lower molding layer. In addition, an overall performance of the stacked package structure can be further improved by disposing the heat dissipation material and the EMI shielding layer.

DETAILED DESCRIPTION

Figure 1:
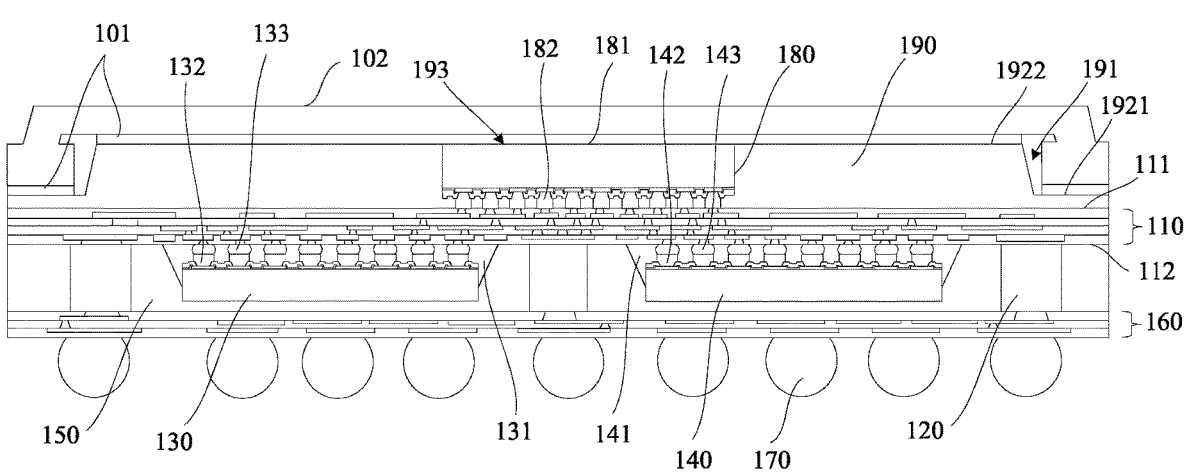
FIG. 1 shows a schematic diagram of a stacked package structure according to a first embodiment of the present disclosure.

Exemplary embodiments will now be described more completely with reference to the accompanying drawings. Exemplary embodiments, however, can be embodied in various forms and should not be construed as limited to the examples set forth herein. Rather, these embodiments are provided so that the present disclosure will be thorough and complete, and will fully express the concept of embodiments to those skilled in the art. The drawings are merely schematic illustrations of the present disclosure and are not necessarily drawn to scale. Same reference numerals in the drawings denote the same or similar parts, and thus their repeated descriptions will be omitted.

Referring to FIG. 1, which shows a schematic diagram of a stacked package structure according to a first embodiment of the present disclosure. The stacked package structure 10 includes an upper redistribution layer (RDL) 110, a first chip 180, an upper molding layer 190, conductive pillars 120, a second chip 130, a third chip 140, a lower molding layer 150, a lower redistribution layer 160, and solder balls 170.

As shown in FIG. 1, the upper redistribution layer 110 includes a first surface 111 and a second surface 112 opposite to the first surface 111. By performing corresponding processes, wires inside the upper redistribution layer 110 and a plurality of connection pads on the first surface 111 and the second surface 112 are formed. The wires are configured to connect the connection pads on the first surface 111 and the connection pads on the second surface 112.

As shown in FIG. 1, a plurality of conductive pillars 120 are disposed on the second surface 112 of the upper redistribution layer 110 and are electrically connected to the upper redistribution layer 110. Specifically, the second surface 112 of the upper redistribution layer 110 is electrically connected to the plurality of conductive pillars 120 through its corresponding connection pads. In this embodiment, a number of conductive pillars 120 is three, but not limited to this. The conductive pillar 120 can be made of copper, aluminum, tin, gold, silver, or a combination thereof.

As shown in FIG. 1, the second chip 130 and the third chip 140 are disposed on the second surface 112 of the upper redistribution layer 110 and are electrically connected to the upper redistribution layer 110. The second chip 130 and the third chip 140 are laterally adjacent to each other. Specifically, an active surface of the second chip 130 are provided with a plurality of second bumps 132, and an active surface of the third chip 140 are provided with a plurality of third bumps 142. Material of the second bumps 132 and the third bumps 142 may be or include copper, gold, nickel, tin-silver alloys, metal alloys, and the like. By performing flip chip bonding to bond the second bumps 132 and the third bumps 142 of the second chip 130 and the third chip 140 to the upper redistribution layer 110, the electrical connections between the second chip 130 and the third chip 140 and the upper redistribution layer 110 are realized. Specifically, the second surface 112 of the upper redistribution layer 110 is provided with a plurality of exposed connection pads. The connection pads are also disposed corresponding to the second bumps 132 of the second chip 130 and the third bumps 142 of the third chip 140, and the connection pads of the upper redistribution layer 110 can be connected to the second bumps 132 and the third bumps 142 correspondingly by soldering and other techniques. In this embodiment, the electrical connections between the second chip 130 and the third chip 140 and the upper redistribution layer 110 are realized through the second bumps 132 and the third bumps 142, which can prevent low-k materials of the second chip 130 and the third chip 140 from cracking due to external stress or internal stress in the process, thereby causing abnormal function or failure and low reliability of the chips. It should be noted that the second surface 112 of the upper redistribution layer 110 can also be connected to more than three chips, i.e., additional chips laterally adjacent to the second chip 130 and the third chip 140, but not limited thereto.

As shown in FIG. 1, there are first conductive terminals 133 between the second chip 130 and the upper redistribution layer 110, and there are second conductive terminals 143 between the third chip 140 and the upper redistribution layer 110. The first conductive terminals 133 are configured to connect the second bumps 132 of the second chip 130 to the upper redistribution layer 110, and the second conductive terminals 143 are configured to connect the third bumps 142 of the third chip 140 to the upper redistribution layer 110. The first conductive terminals 133 and the second conductive terminals 143 may be formed by using a ball-mounting process, an electroplating process, or other suitable processes. In the present embodiment, the first conductive terminals 133 and the second conductive terminals 143 are made of a soldering material (e.g., SnAg) and are formed by using a reflow technique, thereby reducing manufacturing costs and improving manufacturing efficiency. It should be understood that, according to design requirements, the first conductive terminals 133 and the second conductive terminals 143 may adopt other possible materials and shapes, which are not limited thereto. Alternatively, a bonding strength between the first conductive terminals 133 and the second conductive terminals 143 and the corresponding connection pads of the upper redistribution layer 110 is enhanced by using a soldering process or a reflow process.

As shown in FIG. 1, a first underfill layer 131 is disposed between the upper redistribution layer 110 and the second chip 130. The first underfill layer 131 is filled in gaps between the active surface of the second chip 130 and the second surface 112 of the upper redistribution layer 110, and laterally covers connection elements (such as, the second bumps 132 of the second chip 130, the connection pads of the upper redistribution layer 110, and the first conductive terminals 133) between the active surface of the second chip 130 and the second surface 112 of the upper redistribution layer 110. By providing the first underfill layer 131, a bonding strength between the second chip 130 and the upper redistribution layer 110 can be enhanced and the bonding reliability can be improved.

As shown in FIG. 1, similarly, a second underfill layer 141 is disposed between the upper redistribution layer 110 and the third chip 140. The second underfill layer 141 is filled in gaps between the active surface of the third chip 140 and the second surface 112 of the upper redistribution layer 110, and laterally covers connection elements (such as, the third bumps 142 of the third chip 140, the connection pads of the upper redistribution layer 110, and the second conductive terminals 143) between the active surface of the third chip 140 and the second surface 112 of the upper redistribution layer 110. By providing the second underfill layer 141, a bonding strength between the third chip 140 and the upper redistribution layer 110 can be enhanced and the bonding reliability can be improved.

As shown in FIG. 1, the lower molding layer 150 is disposed on the second surface 112 of the upper redistribution layer 110, the second chip 130, and the third chip 140. The lower molding layer 150 encapsulates the second surface 112 of the upper redistribution layer 110 and components (e.g., the conductive pillars 120, the second chip 130, and the third chip 140) disposed thereon, and only corresponding surfaces of the conductive pillars 120 are exposed for electrical connection with subsequently formed components.

As shown in FIG. 1, the lower redistribution layer 160 is disposed on a surface of the lower molding layer 150 away from the upper redistribution layer 110. The lower redistribution layer 160 includes two opposite surfaces. By performing corresponding processes, wires inside the lower redistribution layer 160 and a plurality of connection pads on the two surfaces are formed. The wires are configured to connect the connection pads on the two surfaces. The conductive pillars 120 connects the connection pads of the lower redistribution layer 160 and the connection pads of the upper redistribution layer 110, and further electrically connects the upper redistribution layer 110 and the lower redistribution layer 160.

As shown in FIG. 1, a plurality of solder balls 170 are disposed on a surface of the lower redistribution layer 160 away from the lower molding layer 150. The solder balls 170 may be formed by using a ball-mounting process, an electroplating process, or other suitable processes. In some embodiments, the solder balls 170 are formed by a ball mounting process, thereby reducing manufacturing cost and improving manufacturing efficiency. It should be understood that the solder balls 170 may adopt other possible materials and shapes according to design requirements, and is not limited thereto.

As shown in FIG. 1, the first chip 180 is disposed on the first surface 111 of the upper redistribution layer 110 and is electrically connected to the upper redistribution layer 110. The first chip 180 includes an active surface and a non-active surface 181 opposite to the active surface. In this embodiment, the active surface of the first chip 180 and the active surfaces of the second chip 130 and the third chip 140 are arranged face-to-face. A plurality of first bumps 182 are disposed on the active surface of the first chip 180. It should be understood that the first chip 180 is in a face-up configuration during manufacture, so in some embodiments, the first chip 180 may not include the first bumps 182. Material of the first bumps 182 may be or include copper, gold, nickel, metal alloys, and the like. During manufacture, the first chip 180 is firstly disposed on a carrier, and then the upper molding layer 190 and the upper redistribution layer 110 are sequentially formed. The first bumps 182 of the first chip 180 are bonded to the upper redistribution layer 110 to realize electrical connection between the first chip 180 and the upper redistribution layer 110. Specifically, when forming the upper redistribution layer 110, a layer of dielectric material (such as polyimide) is coated on the first chip 180, and then a plurality of connection pads formed corresponding to the first bumps 182 of the first chip 180 are subsequently formed. The connection pads and the first bumps 182 can be connected correspondingly by appropriate connection techniques. In this embodiment, when viewed from a top of FIG. 1, the first chip 180 partially overlaps with the second chip 130, and the first chip 180 also partially overlaps with the third chip 140. This design is beneficial to realize a multi-chip three-dimensional package with a miniaturized and compact design.

In this embodiment, the first chip 180 may be a system on a chip (SoC). The second chip 130 and the third chip 140 may be memory chips or the like, such as non-volatile and/or volatile memory. The non-volatile memory may include read only memory (ROM), programmable ROM (PROM), electrically programmable ROM (EPROM), electrically erasable programmable ROM (EEPROM), or flash memory. The volatile memory may include random access memory (RAM) and the like.

As shown in FIG. 1, the first chip 180 is electrically connected to the conductive pillars 120, the second chip 130, and the third chip 140 through the upper redistribution layer 110. Specifically, a portion of the first bumps 182 of the first chip 180 are connected to the solder balls 170 of the signal/power/ground I/O terminals through the upper redistribution layer 110 and the conductive pillar 120. The remaining first bumps 182 of the first chip 180 are connected to the second chip 130 and the third chip 140 through inner fine-pitch wires of the upper redistribution layer 110. The second chip 130 and the third chip 140 connect shorter signal paths in the first bumps 182 of the first chip 180 and the upper redistribution layer 110 through the second bumps 132 and the third bumps 142 facing the upper redistribution layer 110.

Furthermore, an orthographic projection of one of the conductive pillars 120 on the lower redistribution layer 160 overlaps with an orthographic projection of the first chip 180 on the lower redistribution layer 160. By connecting the first chip 180, the upper redistribution layer 110, and the lower redistribution layer 160 vertically and directly with the larger conductive pillars 120, the resistance can be effectively reduced, a power path can be shortened, and a power drop can be reduced, thereby achieving good power performance.

As shown in FIG. 1, the upper molding layer 190 is disposed on the first chip 180 and the first surface 111 of the upper redistribution layer 110, and is configured to encapsulate the first chip 180. In this embodiment, the conductive pillars 120, the first chip 180, the second chip 130, and the third chip 140 are stacked and disposed using an embedded technology, so as to minimize a dimension of the stacked package structure 10, and ensure robust interconnection between multiple chips, thereby maintaining height and packaging requirements. That is, multiple chips are stacked three-dimensionally on different fan-out redistribution layers. Therefore, in the stacked package structure 10 of the present disclosure, under a condition that a package width is met, a multi-chip three-dimensional package with a miniaturized and compact design is realized through the upper redistribution layer 110 and the lower redistribution layer 160, thereby providing more design flexibility and freedom for the application of the stacked package structure 10 of the present disclosure in high-end products. On the other hand, advantages of the embedded technology include improving electrical performance, reducing noise, reducing product size (including length and width), and reducing costs. Furthermore, the present disclosure uses the fine wiring of the upper redistribution layer 110 and the lower redistribution layer 160 as a signal transmission path between multiple chips. This effectively increases a speed of signal transmission and reduces the wiring area, thereby ensuring electrical connection between multiple chips, and realizing high circuit density and fine pitch design. Therefore, the performance of the signal transmission speed and signal integrity between multiple chips can be better.

In this embodiment, material of the lower molding layer 150 may be different from material of the upper molding layer 190. For example, in some embodiment, a coefficient of thermal expansion of the material of the lower molding layer 150 is greater than a coefficient of thermal expansion of the material of the upper molding layer 190. In the stacked package structure 10, since a number of components encapsulated in the lower molding layer 150 is greater than a number of components encapsulated in the upper molding layer 190, the usage amount of the material of the lower molding layer 150 is less than the usage amount of the material of the upper molding layer 190. The components inside the molding layers 150/190 and the molding layers 150/190 (such as the conductive pillars 120, the first chip 180, the second chip 130, and the third chip 140) have different coefficients of thermal expansion. By setting the coefficient of thermal expansion of the material of the lower molding layer 150 to be larger than the coefficient of thermal expansion of the material of the upper molding layer 190, warpage and deformation of the stacked package structure 10 can be prevented due to the difference in the overall thermal expansions of the upper and lower molding layers and the internal components. That is, for more embedded components, this means that the amount (volume) of the material of the molding layer will be less, so a molding layer with a higher coefficient of thermal expansion is preferred. Moreover, for less embedded components, this means that the amount (volume) of the material of the molding layer will be higher, so a molding layer with a lower coefficient of thermal expansion is preferred.

Alternatively, in some embodiment, a coefficient of thermal expansion of the material of the lower molding layer 150 is equal to or less than a coefficient of thermal expansion of the material of the upper molding layer 190. As mentioned above, in the stacked package structure 10, the number of components encapsulated in the lower molding layer 150 is greater than the number of components encapsulated in the upper molding layer 190. By setting the coefficient of thermal expansion of the material of the lower molding layer 150 to be equal to or less than that of the material of the upper molding layer 190, the stacked package structure 10 can be successfully formed into a special shape, such as a convex shape, according to actual needs.

It can be understood that in some embodiment, the coefficient of thermal expansion of the material of the lower molding layer 150 can be set to be much greater than that of the material of the upper molding layer 190, so as to form the stacked package structure 10 with a concave shape according to actual needs.

As shown in FIG. 1, the upper molding layer 190 includes a recess 191. The recess 191 is recessed relative to a surface of the upper molding layer 190 away from the upper redistribution layer 110, and the recess 191 is formed around a periphery of the upper molding layer 190. Specifically, the surface of the upper molding layer 190 away from the upper redistribution layer 110 includes at least a first stepped surface 1921 and a second stepped surface 1922, and the first stepped surface 1921 is a bottom surface of the recess 191. In the stacked package structure 10 of the present embodiment, the usage amount of the material of the lower molding layer 150 is less than the usage amount of the material of the upper molding layer 190, and the warpage deformation of the package structure usually occurs around the outer periphery. Therefore, by removing a portion of the upper molding layer 190 to form the recess 191 on the periphery of the outer surface thereof, the internal stress of the upper molding layer 190 can be effectively balanced, thereby preventing the stacked package structure 10 from warping and deforming.

As shown in FIG. 1, the stacked package structure 10 further includes a thermal interface material 101 and a lid 102. The thermal interface material 101 and the lid 102 are arranged on the upper molding layer 190 in sequence, and the thermal interface material 101 is arranged between the lid 102 and the upper molding layer 190. The lid 102 is preferably made of metallic material. Alternatively, an outer edge of the lid 102 is in contact with the first stepped surface 1921 through the thermal interface material 101, or there is no thermal interface material 101 between the outer edge of the lid 102 and the first stepped surface 1921. In this embodiment, covering the first chip 180 and the upper molding layer 190 with the lid 102 can prevent the first chip 180 and the upper molding layer 190 from being damaged, and improve a heat dissipation performance of the stacked package structure 10. Furthermore, the lid 102 covers the first chip 180 and the upper molding layer 190 longitudinally, especially covers the periphery of the upper molding layer 190. Since the lid 102 is made of a metal material with high strength, the arrangement of the lid 102 can effectively enhance a stability of the stacked package structure 10 and prevent the stacked package structure 10 from warping and deforming.

As shown in FIG. 1, in this embodiment, corresponding to a position of the first stepped surface 1921, no additional elements are provided between the upper molding layer 190 and the upper redistribution layer 110. That is, corresponding to the position of the first stepped surface 1921, no additional elements are disposed on the first surface 111 of the upper redistribution layer 110. Therefore, it is also ensured that no additional component will be damaged by internal stresses generated when the lid 102 is formed or while suppressing the deformation.

As shown in FIG. 1, the upper molding layer 190 further includes an opening 193. The opening 193 exposes the non-active surface 181 of the first chip 180. The thermal interface material 101 covers the non-active surface 181 of the first chip 180. The thermal interface material 101 is disposed on the surface of the lid 102 in contact with the upper molding layer 190 and the first chip 180. Therefore, the stacked package structure 10 is ensured to have good heat dissipation performance by the thermal interface material 101.

In this embodiment, the conductive pillars 120, the first chip 180, the second chip 130, and the third chip 140 are arranged inside the stacked package structure 10 by using the embedded technology, external dimensions of the stacked package structure 10 are minimized, thereby maintaining height and packaging requirements. Furthermore, a multi-chip three-dimensional package with a miniaturized and compact design is realized by the upper redistribution layer 110 and the lower redistribution layer 160. On the other hand, by defining the materials and structures of the upper molding layer 190 and the lower molding layer 150, the present disclosure can effectively solve the problem of warpage of the stacked package structure.

Figures 2A, 2B, 2C:
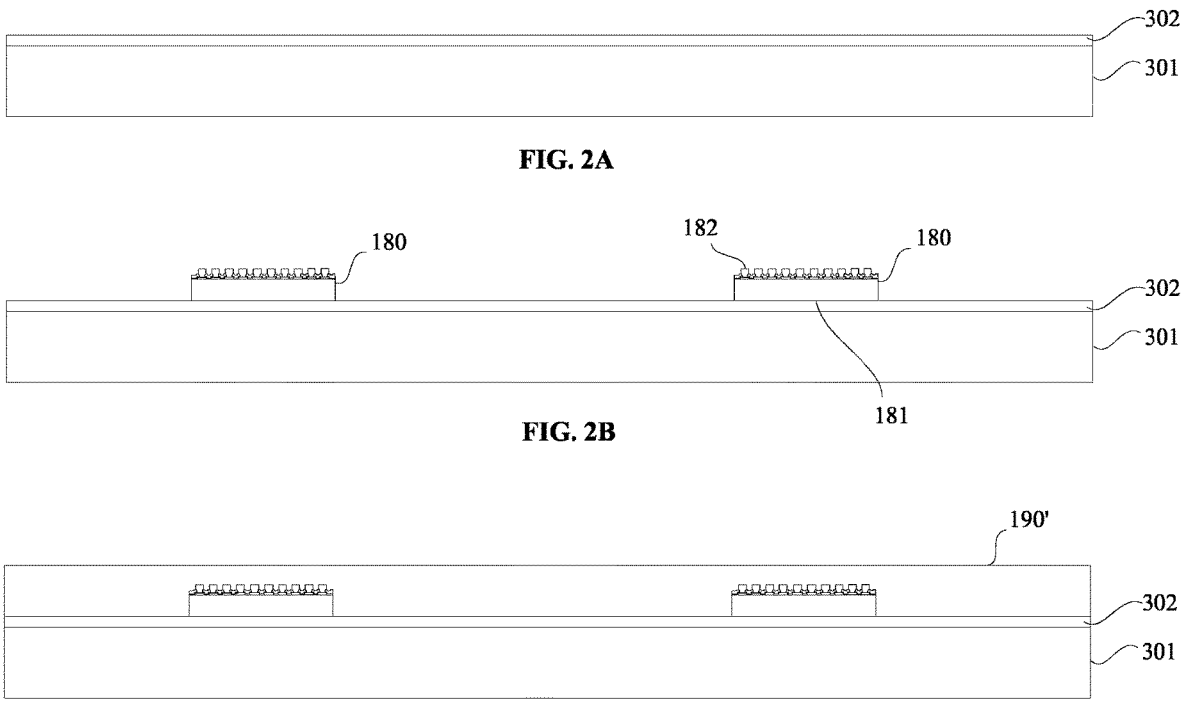
FIG. 2A to FIG. 2P show a series of cross-sectional views for illustrating a manufacturing method of the stacked package structure of FIG. 1.
Figures 2D, 2E, 2F:
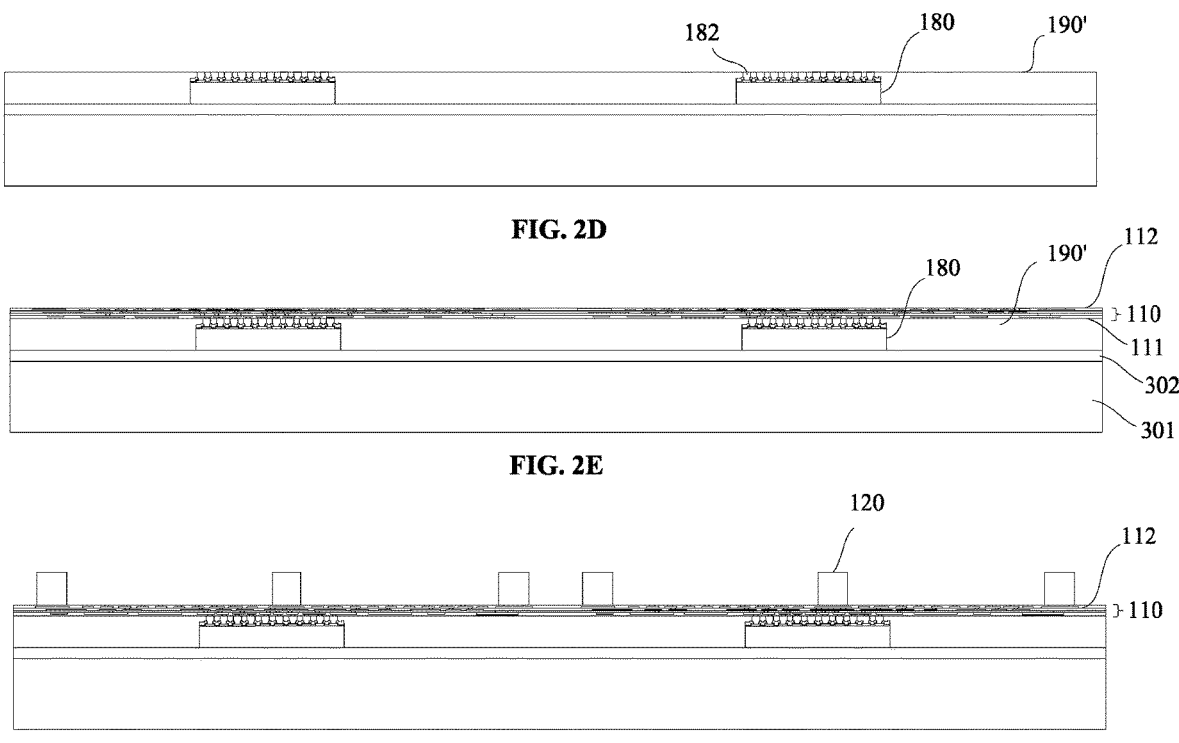
Figures 2G, 2H:
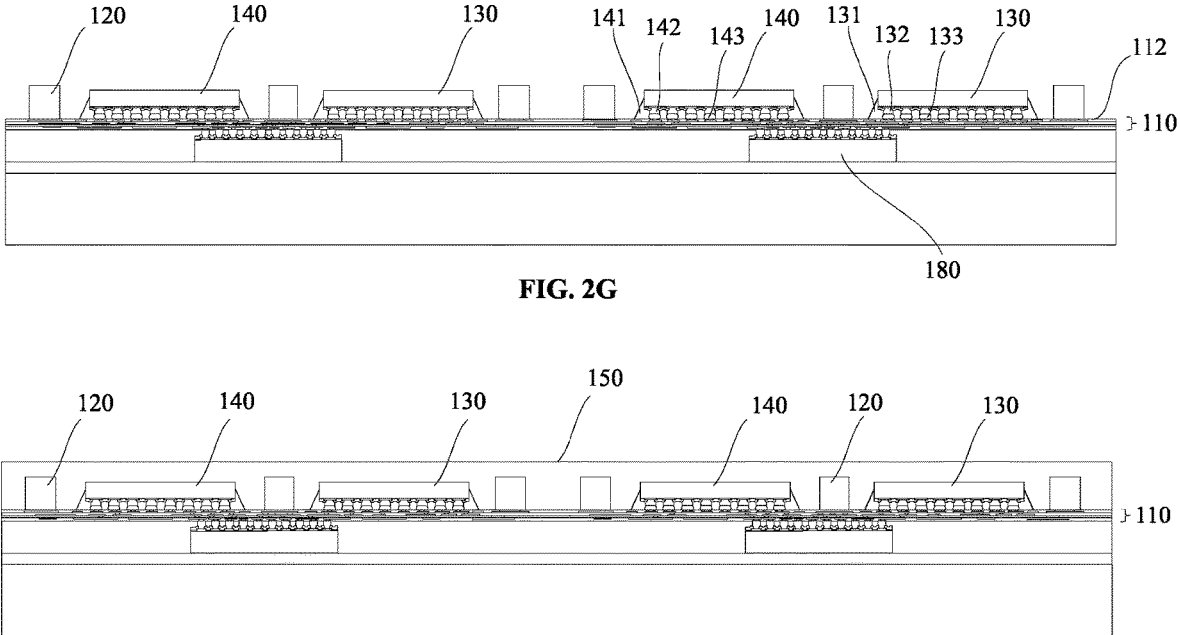
Figure 2I:
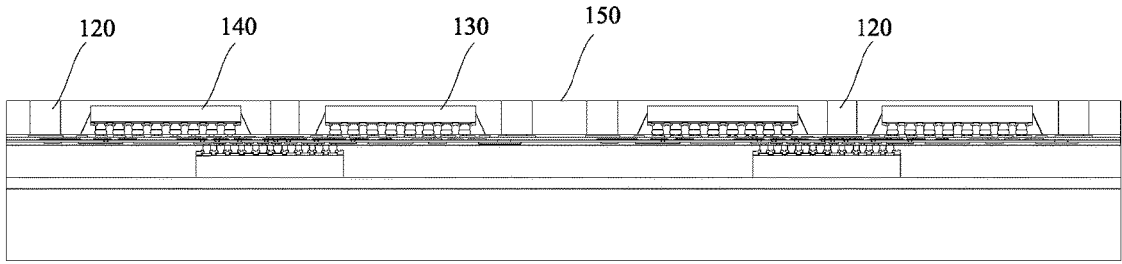
Figure 2J:
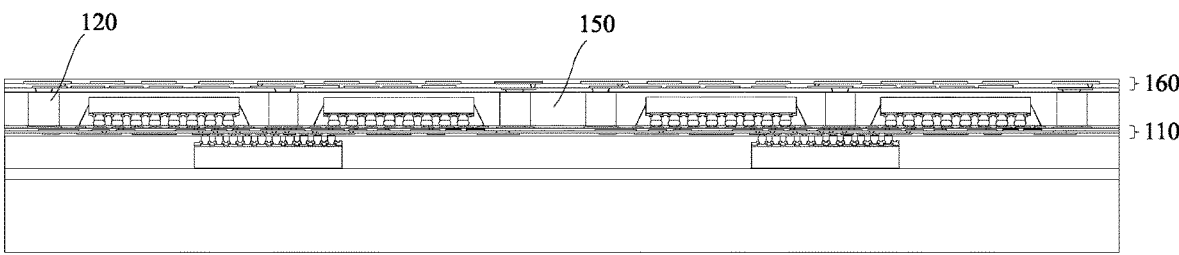
Figure 2K:
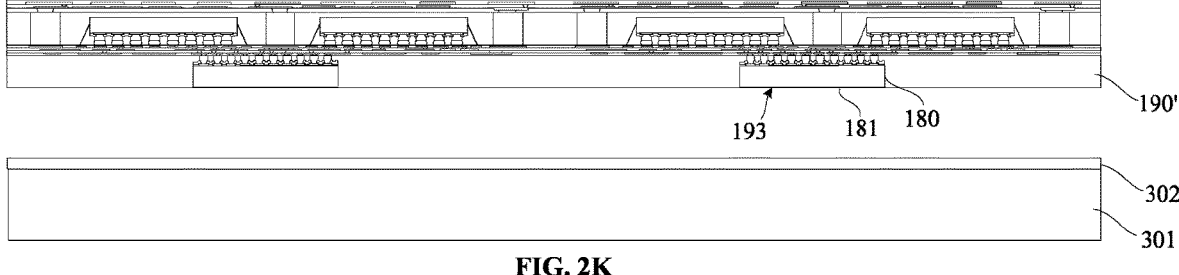
Figure 2L:
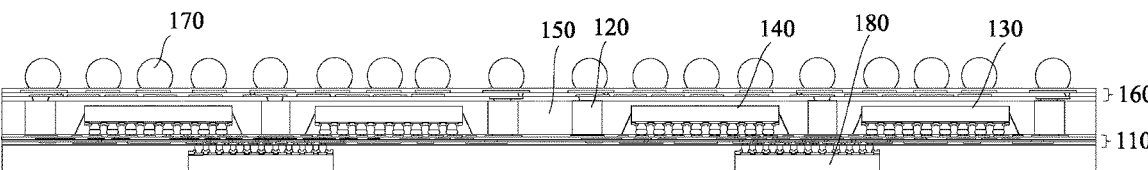
Figure 2M:
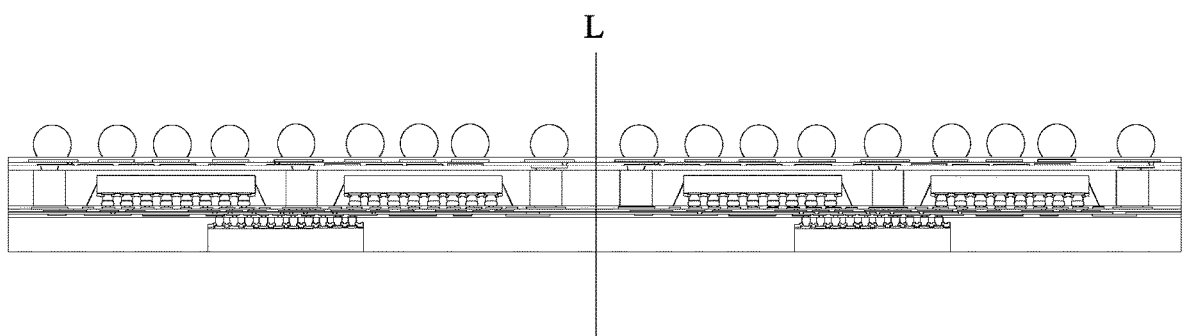
Figure 2N:
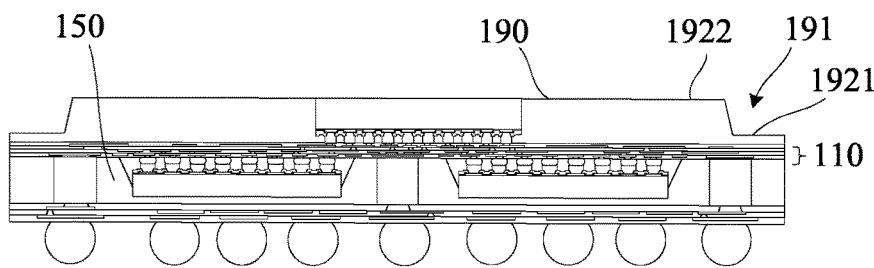
Figure 2O:
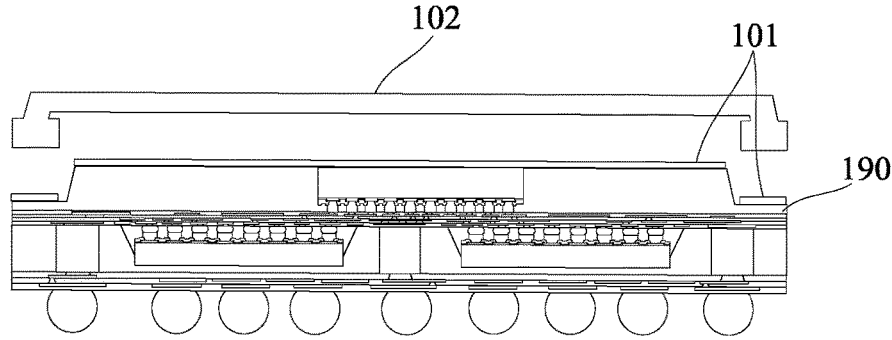
Figure 2P:
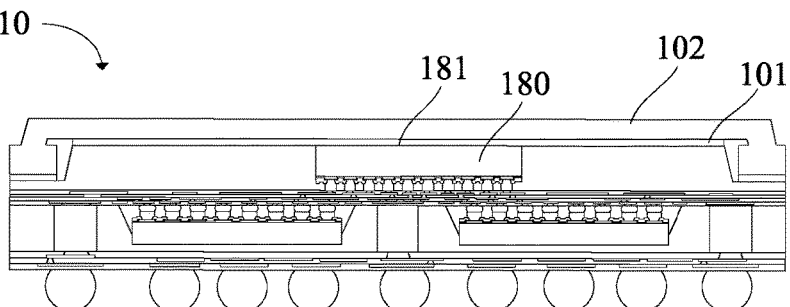

Referring to FIG. 2A to FIG. 2P, which show a series of cross-sectional views for illustrating a manufacturing method of the stacked package structure of FIG. 1.

As shown in FIG. 2A, a carrier 301 is provided, and a separation layer 302 is formed on a surface of the carrier 301. The separation layer 302 is configured to separate a subsequently formed film layer from the surface of the carrier 301. In addition, the separation layer 302 can also provide sufficient bonding strength (through adhesion and/or other bonding strength) between the carrier 301 and the subsequently formed film layer, so that the subsequent film layer can be formed successfully.

As shown in FIG. 2B, the first chip 180 is disposed on the carrier 301. Specifically, the first chip 180 is disposed on a surface of the separation layer 302 away from the carrier 301. The first chip 180 includes an active surface and a non-active surface 181 opposite to the active surface. A plurality of first bumps 182 are formed on the active surface of the first chip 180. Material of the first bumps 182 may be or include copper, gold, nickel, metal alloys, and the like. It should be understood that the first chip 180 is in a face-up configuration during manufacture, so in some embodiments, the first chip 180 may not include the first bumps 182.

As shown in FIG. 2C, a molding layer 190' is formed on the first chip 180 and the carrier 301. The molding layer 190' is configured to encapsulate the first chip 180.

As shown in FIG. 2D, the molding layer 190' is subjected to a thinning process to reduce a thickness of the molding layer 190' and expose corresponding surfaces of the first bumps 182 of the first chip 180 for electrical connection with subsequently formed components. Alternatively, the thinning process can be performed by using a grinder.

As shown in FIG. 2E, the upper redistribution layer 110 is formed on surfaces of the first chip 180 and the molding layer 190' away from the carrier 301. The first chip 180 is electrically connected to the upper redistribution layer 110. The upper redistribution layer 110 includes a first surface 111 and a second surface 112 opposite to the first surface 111. By performing corresponding processes, wires inside the upper redistribution layer 110 and a plurality of connection pads on the first surface 111 and the second surface 112 are formed. The wires are configured to connect the connection pads on the first surface 111 and the connection pads on the second surface 112.

As shown in FIG. 2E, the first bumps 182 of the first chip 180 are bonded to the upper redistribution layer 110 to realize the electrical connection between the first chip 180 and the upper redistribution layer 110. Specifically, when forming the upper redistribution layer 110, a layer of dielectric material (such as polyimide) is coated on the first chip 180, and then a plurality of connection pads corresponding to the first bumps 182 of the first chip 180 are subsequently formed, and the connection pads can be connected to the first bumps 182 of the first chip 180 correspondingly by appropriate connection technology.

As shown in FIG. 2F, the plurality of conductive pillars 120 are formed on the second surface 112 of the upper redistribution layer 110, and the plurality of conductive pillars 120 are electrically connected to the upper redistribution layer 110. Specifically, the second surface 112 of the upper redistribution layer 110 is electrically connected to the plurality of conductive pillars 120 through its corresponding connection pads. In this embodiment, the number of conductive pillars 120 is six, but not limited to this. The conductive pillars 120 can be made of copper, aluminum, tin, gold, silver, or a combination thereof.

As shown in FIG. 2G, after forming the upper redistribution layer 110, the manufacturing method further includes: forming the second chip 130 and the third chip 140 on the second surface 112 of the upper redistribution layer 110. The second chip 130 and the third chip 140 are electrically connected to the upper redistribution layer 110. It should be understood that, in this embodiment, the conductive pillars 120 are formed first and then the second chip 130 and the third chip 140 are formed. However, in other embodiments, the second chip 130 and the third chip 140 may be formed first and then the conductive pillars 120 are formed, but it is not limited to this. In this embodiment, when viewed from a top of FIG. 2G, the first chip 180 and the second chip 130 are partially overlapped, and the first chip 180 is also partially overlapped with the third chip 140. This design is beneficial to realize a multi-chip three-dimensional package with a miniaturized and compact design.

As shown in FIG. 2G, the second chip 130 and the third chip 140 are laterally adjacent to each other. Specifically, an active surface of the second chip 130 are provided with a plurality of second bumps 132, and an active surface of the third chip 140 are provided with a plurality of third bumps 142. Material of the second bumps 132 and the third bumps 142 may be or include copper, gold, nickel, tin-silver alloys, metal alloys, and the like. By performing flip chip bonding to bond the second bumps 132 and the third bumps 142 of the second chip 130 and the third chip 140 to the upper redistribution layer 110, the electrical connections between the second chip 130 and the third chip 140 and the upper redistribution layer 110 are realized. Specifically, the second surface 112 of the upper redistribution layer 110 is provided with a plurality of exposed connection pads. The connection pads are also disposed corresponding to the second bumps 132 of the second chip 130 and the third bumps 142 of the third chip 140, and the connection pads of the upper redistribution layer 110 can be connected to the second bumps 132 and the third bumps 142 correspondingly by soldering and other techniques. In this embodiment, the electrical connections between the second chip 130 and the third chip 140 and the upper redistribution layer 110 are realized through the second bumps 132 and the third bumps 142, which can prevent low-k materials of the second chip 130 and the third chip 140 from cracking due to external stress or internal stress in the process, thereby causing abnormal function or failure and low reliability of the chips. It should be noted that the second surface 112 of the upper redistribution layer 110 can also be connected to more than three chips, i.e., additional chips laterally adjacent to the second chip 130 and the third chip 140, but not limited thereto. In this embodiment, the active surface of the first chip 180 and the active surfaces of the second chip 130 and the third chip 140 are arranged face-to-face.

As shown in FIG. 2G, there are first conductive terminals 133 between the second chip 130 and the upper redistribution layer 110, and there are second conductive terminals 143 between the third chip 140 and the upper redistribution layer 110. The first conductive terminals 133 are configured to connect the second bumps 132 of the second chip 130 to the upper redistribution layer 110, and the second conductive terminals 143 are configured to connect the third bumps 142 of the third chip 140 to the upper redistribution layer 110. The first conductive terminals 133 and the second conductive terminals 143 may be formed by using a ball-mounting process, an electroplating process, or other suitable processes. In the present embodiment, the first conductive terminals 133 and the second conductive terminals 143 are made of a soldering material (e.g., SnAg) and are from by using a reflow technique, thereby reducing manufacturing costs and improving manufacturing efficiency. It should be understood that, according to design requirements, the first conductive terminals 133 and the second conductive terminals 143 may adopt other possible materials and shapes, which are not limited thereto. Alternatively, a bonding strength between the first conductive terminals 133 and the second conductive terminals 143 and the corresponding connection pads of the upper redistribution layer 110 is enhanced by using a soldering process or a reflow process.

As shown in FIG. 2G, a first underfill layer 131 is disposed between the upper redistribution layer 110 and the second chip 130. The first underfill layer 131 is filled in gaps between the active surface of the second chip 130 and the second surface 112 of the upper redistribution layer 110, and laterally covers connection elements (such as, the second bumps 132 of the second chip 130, the connection pads of the upper redistribution layer 110, and the first conductive terminals 133) between the active surface of the second chip 130 and the second surface 112 of the upper redistribution layer 110. By providing the first underfill layer 131, a bonding strength between the second chip 130 and the upper redistribution layer 110 can be enhanced and the bonding reliability can be improved.

As shown in FIG. 2G, similarly, a second underfill layer 141 is disposed between the upper redistribution layer 110 and the third chip 140. The second underfill layer 141 is filled in gaps between the active surface of the third chip 140 and the second surface 112 of the upper redistribution layer 110, and laterally covers connection elements (such as, the third bumps 142 of the third chip 140, the connection pads of the upper redistribution layer 110, and the second conductive terminals 143) between the active surface of the third chip 140 and the second surface 112 of the upper redistribution layer 110. By providing the second underfill layer 141, a bonding strength between the third chip 140 and the upper redistribution layer 110 can be enhanced and the bonding reliability can be improved.

As shown in FIG. 2H, the lower molding layer 150 is formed on the second surface 112 of the upper redistribution layer 110, the second chip 130, and the third chip 140. The lower molding layer 150 encapsulates the second surface 112 of the upper redistribution layer 110 and components (the conductive pillars 120, the second chip 130, and the third chip 140) disposed thereon.

As shown in FIG. 2I, the lower molding layer 150 is subjected to a thinning process to reduce a thickness of the lower molding layer 150 and expose corresponding surfaces of the conductive pillars 120 for electrical connection with the subsequently formed components. Alternatively, the thinning process can be performed by using a grinder.

As shown in FIG. 2J, the lower redistribution layer 160 is disposed on a surface of the lower molding layer 150 away from the upper redistribution layer 110. The lower redistribution layer 160 includes two opposite surfaces. By performing corresponding processes, wires inside the lower redistribution layer 160 and a plurality of connection pads on the two surfaces are formed. The wires are configured to connect the connection pads on the two surfaces. The conductive pillars 120 connects the connection pads of the lower redistribution layer 160 and the connection pads of the upper redistribution layer 110, and further electrically connects the upper redistribution layer 110 and the lower redistribution layer 160.

In this embodiment, the first chip 180 may be a system on a chip (SoC). The second chip 130 and the third chip 140 may be memory chips or the like, such as non-volatile and/or volatile memory. The non-volatile memory may include read only memory (ROM), programmable ROM (PROM), electrically programmable ROM (EPROM), electrically erasable programmable ROM (EEPROM), or flash memory. The volatile memory may include random access memory (RAM) and the like.

As shown in FIG. 2K, the carrier 301 is removed. Specifically, the carrier 301 is separated from the molding layer 190' by the separation layer 302. The carrier 301 can provide good support for the components formed above it, so as to prevent a risk of structural deformation in the steps corresponding to FIGS. 2A to 2J. As shown in FIG. 2K, the molding layer 190' further includes an opening 193 for exposing the non-active surface 181 of the first chip 180.

As shown in FIG. 2L, the plurality of solder balls 170 are formed on the surface of the lower redistribution layer 160 away from the lower molding layer 150. The solder balls 170 may be formed by using a ball-mounting process, an electroplating process, or other suitable processes. In some embodiments, the solder balls 170 are formed by a ball mounting process, thereby reducing manufacturing cost and improving manufacturing efficiency. It should be understood that the solder balls 170 may adopt other possible materials and shapes according to design requirements, and is not limited thereto.

As shown in FIG. 2L, the first chip 180 is electrically connected to the conductive pillars 120, the second chip 130, and the third chip 140 through the upper redistribution layer 110. Specifically, a portion of the first bumps 182 of the first chip 180 are connected to the solder balls 170 of the signal/power/ground I/O terminals through the upper redistribution layer 110 and the conductive pillars 120. The remaining first bumps 182 of the first chip 180 are connected to the second chip 130 and the third chip 140 through inner fine-pitch wires of the upper redistribution layer 110. The second chip 130 and the third chip 140 connect shorter signal paths in the first bumps 182 of the first chip 180 and the upper redistribution layer 110 through the second bumps 132 and the third bumps 142 facing the upper redistribution layer 110.

Furthermore, as shown in FIG. 2L, an orthographic projection of one of the conductive pillars 120 on the lower redistribution layer 160 overlaps with an orthographic projection of the first chip 180 on the lower redistribution layer 160. By connecting the first chip 180, the upper redistribution layer 110, and the lower redistribution layer 160 vertically and directly with the larger conductive pillars 120, the resistance can be effectively reduced, a power path can be shortened, and a power drop can be reduced, thereby achieving good power performance.

As shown in FIG. 2L, the conductive pillars 120, the first chip 180, the second chip 130, and the third chip 140 are stacked and disposed using an embedded technology, so as to minimize a dimension of the stacked package structure 10, and ensure robust interconnection between multiple chips, thereby maintaining height and packaging requirements. That is, multiple chips are stacked three-dimensionally on different fan-out redistribution layers. Therefore, in the stacked package structure 10 of the present disclosure, under a condition that a package width is met, a multi-chip three-dimensional package with a miniaturized and compact design is realized through the upper redistribution layer 110 and the lower redistribution layer 160, thereby providing more design flexibility and freedom for the application of the stacked package structure 10 of the present disclosure in high-end products. On the other hand, advantages of the embedded technology include improving electrical performance, reducing noise, reducing product size (including length and width), and reducing costs. Furthermore, the present disclosure uses the fine wiring of the upper redistribution layer 110 and the lower redistribution layer 160 as a signal transmission path between multiple chips. This effectively increases a speed of signal transmission and reduces the wiring area, thereby ensuring electrical connection between multiple chips, and realizing high circuit density and fine pitch design. Therefore, the performance of the signal transmission speed and signal integrity between multiple chips can be better.

As shown in FIG. 2M, a semi-finished product corresponding to FIG. 2L is disconnected along a separation line L to form a plurality of independent stacked package structures 10. Alternatively, the disconnection of the semi-finished product can be achieved by means of a cutting machine.

As shown in FIG. 2N, a portion of the molding layer 190' is removed to form the upper molding layer 190. The upper molding layer 190 includes a recess 191, the recess 191 is recessed relative to a surface of the upper molding layer 190 away from the upper redistribution layer 110, and the recess 191 is formed around a periphery of the upper molding layer 190. Specifically, the surface of the upper molding layer 190 away from the upper redistribution layer 110 includes at least a first stepped surface 1921 and a second stepped surface 1922, and the first stepped surface 1921 is a bottom surface of the recess 191. In the stacked package structure 10 of the present embodiment, the usage amount of the material of the lower molding layer 150 is less than the usage amount of the material of the upper molding layer 190, and the warpage deformation of the package structure usually occurs around the outer periphery. Therefore, by removing a portion of the upper molding layer 190 to form the recess 191 on the periphery of the outer surface thereof, the internal stress of the upper molding layer 190 can be effectively balanced, thereby preventing the stacked package structure 10 from warping and deforming.

In this embodiment, material of the lower molding layer 150 may be different from material of the upper molding layer 190. For example, in some embodiment, a coefficient of thermal expansion of the material of the lower molding layer 150 is greater than a coefficient of thermal expansion of the material of the upper molding layer 190. In the stacked package structure 10, since a number of components encapsulated in the lower molding layer 150 is greater than a number of components encapsulated in the upper molding layer 190, the usage amount of the material of the lower molding layer 150 is less than the usage amount of the material of the upper molding layer 190. The components inside the molding layers 150/190 and the molding layers 150/190 (such as the conductive pillars 120, the first chip 180, the second chip 130, and the third chip 140) have different coefficients of thermal expansion. By setting the coefficient of thermal expansion of the material of the lower molding layer 150 to be larger than the coefficient of thermal expansion of the material of the upper molding layer 190, warpage and deformation of the stacked package structure 10 can be prevented due to the difference in the overall thermal expansions of the upper and lower molding layers and the internal components. That is, for more embedded components, this means that the amount (volume) of the material of the molding layer will be less, so a molding layer with a higher coefficient of thermal expansion is preferred. Moreover, for less embedded components, this means that the amount (volume) of the material of the molding layer will be higher, so a molding layer with a lower coefficient of thermal expansion is preferred.

Alternatively, in some embodiment, a coefficient of thermal expansion of the material of the lower molding layer 150 is equal to or less than a coefficient of thermal expansion of the material of the upper molding layer 190. As mentioned above, in the stacked package structure 10, the number of components encapsulated in the lower molding layer 150 is greater than the number of components encapsulated in the upper molding layer 190. By setting the coefficient of thermal expansion of the material of the lower molding layer 150 to be equal to or less than that of the material of the upper molding layer 190, the stacked package structure 10 can be successfully formed into a special shape, such as a convex shape, according to actual needs.

It can be understood that in some embodiment, the coefficient of thermal expansion of the material of the lower molding layer 150 can be set to be much greater than that of the material of the upper molding layer 190, so as to form the stacked package structure 10 with a concave shape according to actual needs.

As shown in FIG. 2O, after the upper molding layer 190 is formed, the manufacturing method further includes: sequentially disposing the thermal interface material 101 and the lid 102 on the upper molding layer 190. The thermal interface material 101 is arranged between the lid 102 and the upper molding layer 190. The lid 102 is preferably made of metallic material. Alternatively, an outer edge of the lid 102 is in contact with the first stepped surface 1921 through the thermal interface material 101, or there is no thermal interface material 101 between the outer edge of the lid 102 and the first stepped surface 1921. In this embodiment, covering the first chip 180 and the upper molding layer 190 with the lid 102 can prevent the first chip 180 and the upper molding layer 190 from being damaged, and improve a heat dissipation performance of the stacked package structure 10. Furthermore, the lid 102 covers the first chip 180 and the upper molding layer 190 longitudinally, especially covers the periphery of the upper molding layer 190. Since the lid 102 is made of a metal material with high strength, the arrangement of the lid 102 can effectively enhance a stability of the stacked package structure 10 and prevent the stacked package structure 10 from warping and deforming.

As shown in FIG. 2O, in this embodiment, corresponding to a position of the first stepped surface 1921, no additional elements are provided between the upper molding layer 190 and the upper redistribution layer 110. That is, corresponding to the position of the first stepped surface 1921, no additional elements are disposed on the first surface 111 of the upper redistribution layer 110. Therefore, it is also ensured that no additional component will be damaged by internal stresses generated when the lid 102 is formed or while suppressing the deformation.

As shown in FIG. 2P, after the lid 102 is disposed on the upper molding layer 190, the stacked package structure 10 of the present disclosure is formed. The thermal interface material 101 covers the non-active surface 181 of the first chip 180, and the thermal interface material 101 is disposed on the surface of the lid 102 in contact with the upper molding layer 190 and the first chip 180. Therefore, the stacked package structure 10 is ensured to have good heat dissipation performance by the thermal interface material 101 and the lid 102.

In this embodiment, the conductive pillars 120, the first chip 180, the second chip 130, and the third chip 140 are arranged inside the stacked package structure 10 by using the embedded technology, so as to minimize the dimension of the stacked package structure 10 and maintain the height and packaging requirements. Furthermore, a multi-chip three-dimensional package with a miniaturized and compact design is realized by the upper redistribution layer 110 and the lower redistribution layer 160. On the other hand, by defining the materials and structures of the upper molding layer 190 and the lower molding layer 150, the present disclosure can effectively solve the problem of warpage of the stacked package structure.

Figure 3:
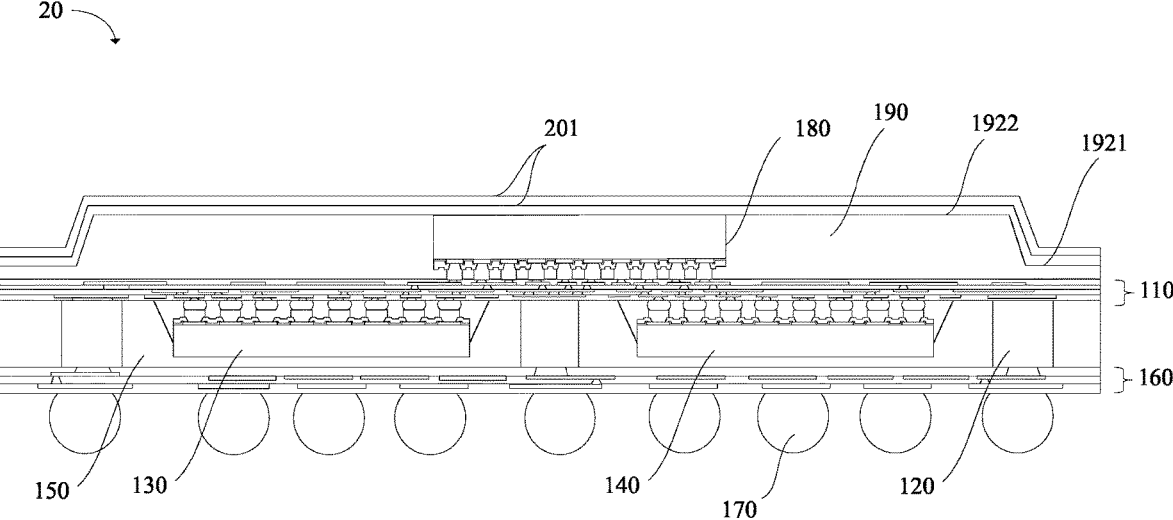
FIG. 3 shows a schematic diagram of a stacked package structure according to a second embodiment of the present disclosure.

FIG. 3 shows a schematic diagram of a stacked package structure according to a second embodiment of the present disclosure. The stacked package structure 20 of the second embodiment includes an upper redistribution layer 110, a first chip 180, an upper molding layer 190, conductive pillars 120, a second chip 130, a third chip 140, a lower molding layer 150, a lower redistribution layer 160, and solder balls 170. The features and manufacturing methods of these elements are the same as those of the corresponding elements in the stacked package structure 10 of the first embodiment, and will not be repeated here.

As shown in FIG. 3, the structure of the stacked package structure 20 of the second embodiment is substantially the same as that of the stacked package structure 10 of the first embodiment, and the differences between the two are that: an electromagnetic interference (EMI) shielding layer 201 is disposed on an entire surface of the stacked package structure 20 in the second embodiment. The EMI shielding layer 201 covers the surface of the upper molding layer 190 away from the upper redistribution layer 110. Specifically, the EMI shielding layer 201 is formed as a whole surface and covers the first stepped surface 1921 and the second stepped surface 1922 of the upper molding layer 190. Alternatively, the EMI shielding layer 201 is a multi-layer metal layer structure made of material, such as Ti/Cu or Ti/Cu/Ti, and formed by using a physical vapor deposition (PVD) technique. In this embodiment, the anti-electromagnetic interference performance of the stacked package structure 20 can be improved by disposing the EMI shielding layer 201.

Figure 4:
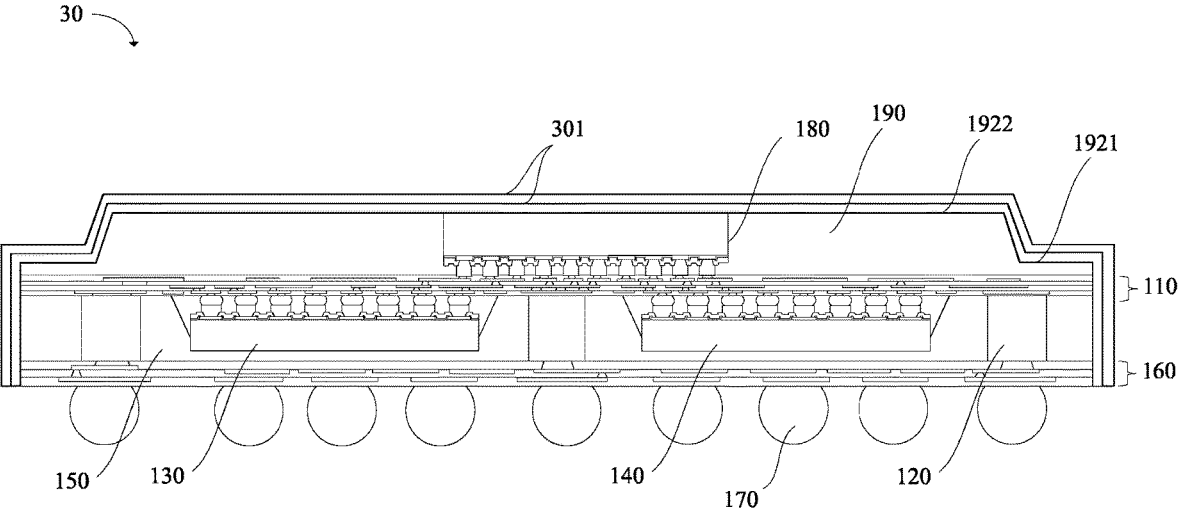
FIG. 4 shows a schematic diagram of a stacked package structure according to a third embodiment of the present disclosure.

FIG. 4 shows a schematic diagram of a stacked package structure according to a third embodiment of the present disclosure. The structure of the stacked package structure 30 of the third embodiment is substantially the same as that of the stacked package structure 20 of the second embodiment, and the differences between the two are that: an electromagnetic interference (EMI) shielding layer 301 is disposed on an entire surface and all side surfaces of the stacked package structure 30 in the third embodiment. Specifically, the EMI shielding layer 301 not only covers the surface of the upper molding layer 190 away from the upper redistribution layer 110, but also covers side surfaces of the upper molding layer 190, the upper redistribution layer 110, the lower molding layer 150, and the lower redistribution layer 160, thereby enhancing the anti-electromagnetic interference performance of the stacked package structure 30.

In the stacked package structure and its manufacturing method of the present disclosure, the conductive pillars, the first chip, the second chip, and the third chip are arranged inside the stacked package structure by using the embedded technology, which minimizes the external dimension of the stacked package structure and maintains height and packaging requirements. Furthermore, a miniaturized and compact design of multi-chip 3D packaging is realized by the upper redistribution layer and the lower redistribution layer. On the other hand, the present disclosure can effectively solve the problem of warpage of the stacked package structure by limiting the materials and structures of the upper molding layer and the lower molding layer. In addition, the overall performance of the stacked package structure can be further improved by disposing the heat dissipation material and the EMI shielding layer.

What is claimed is:

1. A stacked packaging structure, comprising:
an upper redistribution layer comprising a first surface and a second surface opposite to the first surface;
a first chip disposed on the first surface of the upper redistribution layer and electrically connected to the upper redistribution layer; and
an upper molding layer disposed on the first chip and the first surface of the upper redistribution layer, and configured to encapsulate the first chip, wherein the upper molding layer comprises a recess, the recess is recessed relative to a surface of the upper molding layer away from the upper redistribution layer, and the recess is formed around a periphery of the upper molding layer;
wherein no additional elements are provided between the upper molding layer and the upper redistribution layer at a position corresponding to the recess.

2. The stacked packaging structure according to claim 1, wherein the surface of the upper molding layer away from the upper redistribution layer comprises at least a first stepped surface and a second stepped surface, and the first stepped surface is a bottom surface of the recess.

3. The stacked packaging structure according to claim 2, further comprising a lid, wherein the lid is disposed on the upper molding layer.

4. The stacked packaging structure according to claim 3, wherein the upper molding layer further comprises an opening, and the opening is configured to expose a non-active surface of the first chip; and
the stacked package structure further comprises a thermal interface material, the thermal interface material is disposed on the upper molding layer and covers the non-active surface of the first chip, and the thermal interface material is disposed between the lid and the upper molding layer.

5. The stacked packaging structure according to claim 1, further comprising an electromagnetic interference (EMI) shielding layer, wherein the EMI shielding layer covers the surface of the upper molding layer.

6. The stacked packaging structure according to claim 5, further comprising a lower molding layer and a lower redistribution layer, wherein the lower molding layer is disposed on the second surface of the upper redistribution layer, and the lower redistribution layer disposed on a surface of the lower molding layer away from the upper redistribution layer; and
wherein the EMI shielding layer further covers side surfaces of the upper molding layer, the upper redistribution layer, the lower molding layer, and the lower redistribution layer.

7. The stacked packaging structure according to claim 1, further comprising a second chip and a third chip, wherein the second chip and the third chip are disposed on the second surface of the upper redistribution layer and electrically connected to the upper redistribution layer, the second chip is laterally adjacent to the third chip, and the first chip is electrically connected to the third chip and the second chip through the upper redistribution layer.

8. The stacked packaging structure according to claim 7, further comprising a lower molding layer disposed on the second surface of the upper redistribution layer, and configured to encapsulate the second chip and the third chip, wherein material of the lower molding layer is different from material of the upper molding layer.

9. The stacked packaging structure according to claim 8, wherein a coefficient of thermal expansion of the material of the lower molding layer is different from a coefficient of thermal expansion of the material of the upper molding layer.

10. The stacked packaging structure according to claim 8, further comprising:
a lower redistribution layer disposed on a surface of the lower molding layer away from the upper redistribution layer;
at least one conductive pillar electrically connected the upper redistribution layer and the lower redistribution layer; and
a plurality of solder balls disposed on a surface of the lower redistribution layer away from the lower molding layer.

11. The stacked packaging structure according to claim 10, wherein an orthographic projection of the at least one conductive pillar on the lower redistribution layer overlaps with an orthographic projection of the first chip on the lower redistribution layer, and the first chip is electrically connected to the at least one conductive pillar through the upper redistribution layer.

* * * * *